United States Patent [19]

Shimizu

[11] Patent Number: 5,706,244
[45] Date of Patent: Jan. 6, 1998

[54] SEMICONDUCTOR MEMORY DEVICE HAVING SHARED SENSE AMPLIFIER ARRAYS INDIVIDUALLY CONTROLLED FOR CACHE STORAGE

[75] Inventor: Tamio Shimizu, Tokyo, Japan

[73] Assignee: NEC Corporation, Tokyo, Japan

[21] Appl. No.: 549,943

[22] Filed: Oct. 30, 1995

[30] Foreign Application Priority Data

Oct. 28, 1995 [JP] Japan .................................. 6-265598

[51] Int. Cl.$^6$ ........................................................ G11C 7/00
[52] U.S. Cl. ........................ 365/230.03; 365/49; 365/207
[58] Field of Search .......................... 365/230.03, 49, 365/207

[56] References Cited

U.S. PATENT DOCUMENTS 5,600,605  2/1997  Schaefer ................... 365/230.03 X

*Primary Examiner*—Do Hyun Yoo
*Attorney, Agent, or Firm*—Sughrue, Mion, Zinn, Macpeak & Seas, PLLC

[57] ABSTRACT

A semiconductor dynamic random access memory device has shared sense amplifier units used for not only magnification of data bits but also serving as a cache storage, and a cache system incorporated in the semiconductor dynamic random access memory device individually controls the sense amplifier units to determine whether to allow an access to the selected sense amplifier unit, thereby enhancing the hit ratio.

4 Claims, 11 Drawing Sheets

SEMICONDUCTOR MEMORY DEVICE HAVING SHARED SENSE AMPLIFIER ARRAYS INDIVIDUALLY CONTROLLED FOR CACHE STORAGE

FIELD OF THE INVENTION

This invention relates to a semiconductor memory device and, more particularly, to a semiconductor memory device having shared sense amplifier arrays individually controlled for a cache storage.

DESCRIPTION OF THE RELATED ART

Progressive development of computer technologies requires a high-through-put large capacity economical memory device, and various semiconductor memory devices have been proposed. For example, Japanese Patent Publication of Unexamined Application No. 3-212891 discloses a semiconductor dynamic random access memory device having a plurality of memory cell blocks associated with static random access memory cells. The memory cell blocks are implemented by dynamic random access memory cells, and the static random access memory cells serve as a cache memory, and improves the through-put of the data access. Similar technologies are disclosed in U.S. Pat. Nos. 4,577,293 and 4,649,516.

Another approach is to use sense amplifier circuits as a cache memory, and Japanese Patent Publication of Unexamined Application No. 61-74041 discloses dynamic random access memory devices using sense amplifiers as the cache memory.

FIG. 1 illustrates a typical example of the standard semiconductor dynamic random access memory device. Reference numeral 1 designates a semiconductor dynamic random access memory device, and the semiconductor memory device is equipped with memory cell blocks 2a, 2b, 2c and 2d. The memory cell blocks 2a to 2d form in combination a memory cell array 2, and memory cells are arranged in rows and columns for forming each of the memory cell blocks 2a to 2d. Though not shown in FIG. 1, word lines are respectively associated with the rows of memory cells of each memory cell block 2a/2b/2c/2d, and bit line pairs are further associated with the columns of memory cells of each memory cell blocks 2a/2b/2c/2d, respectively.

The prior art semiconductor dynamic random access memory device further comprises row address decoders 3a, 3b, 3c and 3d associated with the memory cell blocks 2a to 2d, respectively, and each of the row address decoders 3a to 3d selectively energizes the word lines of the associated memory cell blocks. The row address decoders 3a to 3d are under the control of a block decoder 4. Namely, the block decoder 4 selectively enables the row address decoders 3a to 3d, and the selected row address decoder 3a/3b/3c/3d becomes responsive to internal row address signals.

The prior art semiconductor dynamic random access memory device further comprises sense amplifier units 4a, 4b, 4c and 4d, and the sense amplifier units 4a to 4d are respectively associated with the memory cell blocks 2a to 2d to magnify potential differences on the bit line pairs for the associated memory cell block. The sense amplifier units 4a to 4e are coupled through column selectors (not shown) to a data bus 5, and a column address decoder 6 is shared between the column selectors.

The prior art semiconductor dynamic random access memory device further comprises an address buffer unit 7 coupled to an address port ADD and a selector unit 8 coupled between the address buffer unit 7 and the row/block/column decoders 3a–3d/4/6. An external row address signal and an external column address signal are supplied to the address port ADD serially, and the address buffer unit 7 generates the internal row address signals and internal block address signals from the external row address signal and internal column address signals from the external column address signal.

The selector 8 supplies the internal block address signals to the block address decoder 4 and the internal row address signals to the row address decoders 3a to 3d. As described hereinbefore, the block address decoder 4 enables one of the row address decoders 3a to 3d associated with the memory cell block indicated by the internal block address signals, and the enabled row address decoder selects one of the word lines in response to the internal row address signals.

The selector 8 transfers the internal column address signals to the column decoder 6, and the column decoder 6 causes the column selector (not shown) to couple a sense amplifier circuit associated with the selected bit line pair indicated by the internal column address signals to the data bus 5. Then, the potential difference magnified by the sense amplifier circuit is transferred from the selected bit line pair to the data bus 5, or a potential difference indicative of a write-in data bit is transferred from the data bus 5 to the selected bit line.

The prior art semiconductor dynamic random access memory device further comprises an input data buffer circuit 9a and an output data buffer circuit 9b both coupled between the data bus 5 and a data port DQ. The input data buffer circuit 9a generates the potential difference on the data bus 5 from an input data signal, and the output data buffer circuit 9b generates an output data signal from the potential difference indicative of the read-out data bit on the selected bit line pair.

The prior art semiconductor dynamic random access memory device further comprises a control circuit 10 coupled to control signal pins RAS, CAS and WE and a sense control circuit 11 for the sense amplifier units 4a to 4d, and the selector 8, the sense control circuit 11 and the input/output data buffer circuits 9a/9b are supervised by the control circuit 10. A row address strobe signal of an active low level and a column address strobe signal of the active low level are respectively supplied to the control signal pins RAS and CAS, and the control circuit 10 causes the selector 8 to appropriately distribute the internal block address signals, the internal row address signals and the internal column address signals to the block address decoder 4, the row address decoders 3a to 3d and the column address decoder 6. The control circuit 10 requests the sense control circuit 11 to selectively activate the sense amplifier units 4a to 4d at an appropriate time, and causes the selected amplifier circuits of the selected unit to magnify the potential differences on the bit line pairs. The control circuit 10 further responds to the write enable signal WE, and selectively enables the input data buffer circuit 9a and the output data buffer circuit 9b at an appropriate time. Finally, the control circuit 10 requests the sense amplifier units 4a to 4d to change the bit line pairs to a precharge level HVC for the next data access.

Turning to FIG. 2 of the drawings, the sense amplifier unit 4b associated with the memory cell block 2b includes sense amplifier circuits 4ba, transfer gate circuits 4bb and precharge/balance circuits 4bc. Other sense amplifier units 4a to 4c are similar in circuit arrangement to the sense amplifier unit 4b, and only the sense amplifier unit 4b is described hereinbelow in detail.

The sense amplifier circuit 4ba is implemented by two complementary inverters, i.e., a series combination of a p-channel enhancement type field effect transistor Qp1 and an n-channel enhancement type field effect transistor Qn1 and a series combination of another p-channel enhancement type field effect transistor Qp2 and another n-channel enhancement type field effect transistor Qn2. The complementary inverters are coupled between a high voltage line Sn and a low voltage line Sp, and is associated with the bit line pair BL. The bit line pair BL consists of bit lines BLa and BLb, and the transfer gate circuit 4bb splits the bit line pair BL into the first section coupled to the sense amplifier circuit 4ba and the second section coupled to the precharge/balance circuit 4bc and the column of memory cells. The bit line BLa is connected to the common drain node DNa between the field effect transistors Qn1 and Qp1 and further to the gate electrodes of the other field effect transistors Qn2 and Qp2, and the other bit line BLb is connected to the common drain node DNb between the field effect transistors Qn2/Qp2 and the gate electrodes of the field effect transistors Qn1/Qp1. A small potential difference on the shared bit line pair BL causes the p-channel enhancement type field effect transistors Qp1/Qp2 to complementarily turn on and off and the n-channel enhancement type field effect transistors Qn1/Qn2 to also complementarily turn on and off. As a result, the potential difference on the shared bit line pair BL is magnified by the sense amplifier circuit 4ba.

N-channel enhancement type switching transistors Qn3/Qn4 form in combination the transfer gate circuit 4bb. The n-channel enhancement type switching transistors Qn3 and Qn4 are gated by a gate control line AG, and provide signal paths between the first section and the second section.

The precharge/balance circuit 4bc is coupled between a precharge line Lhvc and the second section of the bit line pair BL, and equalizes the potential level on the bit lines BLa/BLb at the precharge level HVC. P-channel enhancement type switching transistors Qp3/Qp4/Qp5 form in combination the precharge/balance circuit 4bc, and are concurrently gated by a precharge control line PC. When the precharge control line goes down to the active low level, the p-channel enhancement type switching transistors Qp3 to Qp5 concurrently turn on, and charge and balance the bit lines BLa and BLb.

The behavior of the prior art semiconductor dynamic random access memory device will no be described with reference to FIG. 3. The memory cell MC (see FIG. 2) is assumed to be accessed. First, the row address strobe signal decays the control signal pin RAS at time t1, and the external row address signal at the address port ADD is stored in the address buffer unit 7. The internal block address signals and the internal row address signals are generated from the external row address signal, and the selector 8 distributes the internal block address signals and the internal row address signals to the block address decoder 4 and the row address decoders 3a to 3d.

The sense control circuit 11 has maintained the gate control signal AG at the high level H, and the transfer gate circuit 4bb electrically connects the first section of the bit line pair BL to the second section thereof. While the precharge control signal PC remains in the active low level, the precharge/balance circuit 4bc equalizes the bit lines BLa/BLb at the precharge level HVC. The sense control circuit 11 changes the precharge control signal PC from the active low level to the inactive high level at time t2, and the bit line pair BL is electrically isolated from the precharge voltage line Lhvc. The gate control line AG is being maintained at the high level H.

The block address decoder 4 enables the row address decoder 3b, and the row address decoder 3b boosts the word line WL in response to the internal row address signals at time t3. Then, the associated row of memory cells are electrically connected to the bit line pairs of the memory cell block 2b, and small potential differences take place on the bit line pairs. The memory cell MC generates one of the small potential differences on the associated bit line pair BL at time t4. The small potential difference is propagated from the bit line pair BL through the transfer gate circuit 4bb to the sense amplifier circuit 4ba.

The high and low voltage lines Sp and Sn are separated from the middle level to the high level and the low level at time t5, and the sense amplifier circuits 4ba are activated so as to magnify the small potential differences. The potential difference on the bit line pair BL is magnified by the sense amplifier circuit 4ba, and the potential levels on the bit line BLa and BLb reach the high level and the low level at time t6.

The external column address signal is supplied to the address port ADD, and the column address strobe signal CAS is changed to the active low level at time t7. The external column address signal is stored in the address buffer 7, and the address buffer 7 generates the internal column address signals from the external column address signal.

The selector 8 supplies the internal column address signals to the column address decoder 6, and the column address decoder 6 causes the column selector (not shown) associated with the sense amplifier unit 4b to connect the bit line pair BL to the data bus 5.

If the write enable signal is in the low level indicative of the write-in mode, the input data buffer 9a generates a potential difference indicative of a write-in data bit from the input data signal, and the potential difference is transferred to the data bus 5 to the bit line pair BL. If the write-in data bit is identical in logic level with the read-out data bit, the potential difference on the bit line pair BL is not changed. However, if the write-in data bit is opposite in logic level to the read-out data bit, the sense amplifier circuit 4ba inverts the potential level on the bit lines BLa and BLb.

On the other hand, if the write enable signal is indicative of the read-out mode, the potential difference on the bit line pair BL is transferred through the column selector (not shown) to the data bus 5, and the output data buffer 9b enabled with an output enable signal OE generates the output data signal from the potential difference on the data bus 5. The output data signal is delivered from the data port DQ.

While the row address strobe signal RAS is being maintained at the active low level, the sense amplifier circuits 4ba hold the read-out data bits in the form of potential difference.

The row address strobe signal and the column address strobe signal are changed to the inactive high level at time t8, and the row address decoder 3b recovers the word line WL to the low level. The high and low voltage lines Sp and Sn are changed to the middle level, and the sense amplifier circuits 4ba cancel the read-out data bits stored therein. The precharge control signal PC is changed to the active low level, and the precharge/balance circuits 4bc equalize the bit line pairs at the precharge level HVC.

The sense amplifier units are respectively associated with the memory cell blocks, and have been increased together with the memory capacity of the dynamic random access memory device. The real estate assigned to the sense amplifier units becomes wide. A shared sense amplifier circuit has proposed so as to decrease the number of sense amplifier units.

FIG. 4 illustrates shared sense amplifier units 10a and 10b incorporated in another prior art dynamic random access memory device. The sense amplifier unit 10a is shared between adjacent two memory cell blocks 11a and 11b, and row address decoders 12a, 12b and 12c are respectively provided for the memory cell blocks 11a to 11c. The basic arrangement of each memory cell block and the associated sense amplifier units is similar to the other memory cell blocks and the associated sense amplifier units, and, for this reason, description is hereinbelow focused on the memory cell block 11b and the sense amplifier units 10a and 10b.

The memory cell block 11b has a plurality of memory cells respectively represented by small circles, and the memory cells are arranged in rows and columns. Word lines WL1 to WLm are respectively associated with the rows of memory cells, and the row address decoder 12b selectively energizes the word lines WL1 to WLm. Bit line pairs BL1, BL2, . . . are further associated with the columns of memory cells, and are alternately coupled to the sense amplifier unit 10a and the sense amplifier unit 10b.

The sense amplifier unit 10a has sense amplifier circuits 10c respectively, coupled to half of the bit line pairs, and the sense amplifier circuits 10c are shared with half of the bit line pairs BL' of the memory cell block 11a. Sense amplifier circuits 10d of the unit 10b are coupled to the other half of the bit line pairs, and are shared with bit line pairs BL" of the memory cell block 11c.

Precharge/balance circuits 13ba and 13bb are respectively coupled to the bit line pairs BL1, BL2, . . . , and equalize the bit lines of the pairs BL1, BL2, . . . at the precharge level as similar to the precharge/balance circuit 4bc. The bit line pairs BL' and the bit line pairs BL" are also coupled to precharge/balance circuits 13a and precharge/balance circuits 13c, respectively.

Transfer gates 14ba are respectively coupled between the sense amplifier circuits 10c and the precharge/balance circuits 13ba, and transfer gates 14a are respectively coupled between the sense amplifier circuits 10c and the precharge/balance circuits 13a. Block selecting signals BS(n−1), BSn and BS(n+1) are respectively supplied to the memory cell blocks 11a, 11b and 11c and the associated row address decoders 12a, 12b and 12c, and two block selecting signals BS(n−1)/BSn and BSn/BS(n+1) are respectively supplied to OR gates OR1/OR2. Each of the block selecting signal BS(n−1)/BSn/BS(n+1) completes the precharge/equalization of the associated precharge/balance circuits 13a/13ba–13bb/13c, and changes the associated transfer gates 14a/14ba–14bb/14c to the on-state. Moreover, the block selecting signal of the active high level BS(n−1), BSn or BS(n+1) causes the associated row address decoder 12a, 12b or 12c to become responsive to internal row address signals.

Two adjacent block selecting signals BS(n−1)/BSn or BSn/BS(n+1) are not concurrently changed to the active high level. For this reason, the sense amplifier circuits 10c or 10d are never concurrently coupled to the bit line pairs BL' and BL1 or BL2 and BL" on both sides thereof. However, one of the adjacent two block selecting signals BS(n−1)/BSn or BSn/BS(n+1) allows the sense amplifier circuits 10c or 10d to start the magnification of potential differences through the OR gate OR1 or OR2.

The block selecting signal BSn is assumed to be changed to the active high level, and the other block selecting signals BS(n−1) and BS(n+1) remain in the inactive low level.

The precharge/balance circuits 13ba and 13bb complete the precharge/equalization, and isolate the bit line pairs BL1, BL2, . . . from the precharge line (not shown). The block selecting signal BSn of the active high level causes the transfer gates 14ba and 14bb to turn on, and the bit line pairs BL1, BL2, . . . are coupled to the sense amplifier circuits 10c and the sense amplifier circuits 10d. Moreover, the block selecting signal BSn makes the row address decoder 12b become responsive to the internal row address signals.

On the other hand, the block selecting signals BS(n−1) and BS(n+1) of the inactive low level allow the precharge/balance circuits 13a and 13c to continue the precharge/equalization on the bit line pairs BL' and BL", and keep the transfer gates 14a and 14c off. The row address decoders 12a and 12c never respond to the internal row address signals.

Only the row address decoder 12b is responsive to the internal row address signals so as to boost one of the word lines WL1 to WLm, and the associated row of memory cells are coupled to the bit line pairs BL1, BL2, . . . . Small potential differences take place on the bit line pairs BL1, BL2, . . . . The potential differences on the bit line pairs BL1, . . . are propagated through the transfer gates 14ba to the sense amplifier circuits 10c, and the transfer gates 14bb transfer the potential differences on the bit line pairs BL2, . . . to the sense amplifier circuits 10d.

The block selecting signal BSn of the active high level causes the OR gates OR1/OR2 to activate the sense amplifier circuits 10c and 10d, and the sense amplifier circuits 10c and 10d magnify the potential differences on the bit line pairs BL1, BL2, . . . .

Thus, the shared sense amplifier unit 10a/10b selectively magnifies the potential differences on the bit line pairs associated with the memory cell blocks 11a/11b or 11b/11c on both sides thereof. Therefore, the number of sense amplifier units is drastically decreased, and the shared sense amplifier units are useful for an ultra large memory capacity dynamic random access memory device.

FIG. 5 illustrates a semiconductor dynamic random access memory device having four memory cell blocks 21a, 21b, 21c and 21d. Five sense amplifier units 22a, 22b, 22c, 22d and 22e are provided for the four memory cell blocks 21a to 21d, and are shared sense amplifier units, and the sense amplifier circuits of each unit 22a/22b/22c/22d/22e are half of the bit line pairs incorporated in each of the memory cell blocks 21a/21b/21c/21d. Although the sense amplifier units 22a and 22e are exclusive to the memory cell blocks 21a and 21d, respectively, each of the other sense amplifier units 22b to 22d is shared between the adjacent two memory cell blocks 21a/21b, 21b/21c, 21c/21d. The shared sense amplifier units 22b/22c/22d each magnifies the potential differences supplied from either associated memory cell blocks 21a/21b, 21b/21c, 21c/21d. For example, while the shared sense amplifier unit 22b is magnifying the potential differences supplied from the memory cell block 21a, the other memory cell block 21b is never accessed. On the other hand, the memory cell block 21a stands idle during the magnification of the potential differences for the other memory cell block 21b. However, the total sense amplifier circuits are decreased to 60 percent of the non-shared sense amplifier units.

As described hereinbefore, the sense amplifier circuits are available for cache storage. The prior art semiconductor dynamic random access memory device shown in FIGS. 1 to 3 changes the high and low power supply lines Sp and Sn to the middle level upon completion of the data access, and cancels the read-out data bits stored in the sense amplifier circuits 4ba. However, when the sense amplifier units 22e are used as the cache memory, the high and low power voltage lines Sp and Sn are continuously held at the high and low levels, and the sense amplifier units store the data bits after the reset of the selected word line. For this reason, an external device can sequentially access the data bits stored in the sense amplifier circuits without boosting word lines.

FIG. 6 illustrates the sequential read-out from the sense amplifier circuits. Assuming now that an external device sequentially tries to access data bits stored in the memory cell block 21b, the external device supplies a row address signal indicative of a new row address to the semiconductor dynamic random access memory device in synchronism with the decay of the row address strobe signal RAS at time t11. Thereafter, the external device further supplies a column address signal to the semiconductor dynamic random access memory device.

The semiconductor dynamic random access memory device compares the new row address with the previous row address used for the previous access to the same memory cell block 21b. If the new row address is not matched with the previous row address, the read-out data bits already stored in the sense amplifier units 22b and 22c are canceled, and the row address decoder 23 boosts the word line assigned the new row address at time t12. The sense amplifier units 22b and 22c are powered through the high and low power supply lines Sp and Sn, and magnify the potential differences indicative of data bits read out from the memory cells coupled to the boosted word line. Thus, the sense amplifier units 22b and 22c latch the read-out data bits, and a read-out data bit is transferred through the column selector (not shown) to the data output buffer (not shown).

Even though the word line is reset at time t13, the high and low power lines are maintained at the high and low levels, and the sense amplifier units 22b and 22c hold the read-out data bits.

The external device sequentially supplies row addresses to the semiconductor dynamic random access memory device in synchronism with decays of the row address strobe signal at times t14 and t15. Column addresses follows the row addresses. The row addresses are matched with the row address used for the access at time t11, and the column selector (not shown) transfers the read-out data bits stored in the sense amplifier units 22b/22c to the output data buffer (not shown).

Even if the row addresses are not matched with the row address supplied at time t11, the external device can quickly access read-out data bits stored in the other sense amplifier units in so far as the row addresses are the same as those used for the previous access to the memory cell block 21d.

If a row address supplied at time t16 is different from the previous row addresses, the semiconductor dynamic random access memory device cancels the previous read-out data bits stored in the sense amplifier units, and a new word line is boosted at time t17.

Thus, the sense amplifier units 22a to 22e are available for the cache storage. The cache storage not only enhances the average access speed but also decreases the current consumption.

However, a problem is encountered in the prior art semiconductor dynamic random access memory device in that the shared sense amplifier units 22a to 22e are not fully available for the cache storage. If sense amplifier units S0 to S15 serve as the cache storage for eight memory cell blocks M0, M2, M4, M6, M8, M10, M12 and M14 as shown in FIG. 7A, only one sense amplifier unit S16 stands idle. However, if the memory cell blocks M0, M3, M6, M9, M12 and M15 are selected as shown in FIG. 7B, sense amplifier units S0, S1, S3, S4, S6, S7, S9, S10, S12, S13, S15 and S16 serve as the cache storage, and the other sense amplifier units S2, S5, S8, S11 and S14 stand idle. Therefore, the hit ratio is relatively low.

SUMMARY OF THE INVENTION

It is therefore an important object of the present invention to provide a semiconductor memory device shared sense amplifier units of which are fully available for a cache storage.

To accomplish the object, the present invention proposes to individually control sense amplifier units.

In accordance with one aspect of the present invention, there is provided a semiconductor memory device comprising: a memory cell array including a plurality of memory cell blocks formed by memory cells arranged in an array in a row direction and a column direction, a plurality of bit line pairs connected to columns of the memory cells, respectively, and a plurality of word lines connected to rows of the memory cells, respectively; and a plurality of sense amplifiers connected to ends of the plurality of bit line pairs, respectively, and responsive to an activation signal for magnifying potential differences on the plurality of bit line pairs, the plurality of sense amplifiers being divided into a plurality of sense amplifier groups each shared between an two of the plurality of memory cell blocks so as to be used by a selected one of the adjacent two of the plurality of memory cell blocks, the plurality of sense amplifier groups forming a cache storage so that data is read out from the plurality of sense amplifiers when a row address selected in a data access to the memory cells is matched with a row address assigned to a row of memory cells supplying the data to the plurality of sense amplifiers, the plurality of sense amplifier groups being individually controlled during an access to the cache storage.

In accordance with another aspect of the present invention, there is provided a semiconductor memory device comprising: a memory cell array including a plurality of memory cell blocks each having memory cells arranged in rows and columns; a plurality of bit line pair groups respectively associated with the plurality of memory cell blocks, the bit line pairs of each of the plurality of bit line pair groups being respectively connected to columns of the memory cells of an associated one of the plurality of memory cell blocks; a plurality of word lines respectively coupled to rows of the memory cells of the plurality of memory cell blocks, and selectively energized so as to read out data bits to associated bit line pairs; a plurality of sense amplifier units including shared sense amplifier units each shared between two of the plurality of bit line pair groups, and responsive to an activation signal of an active level so that two of the plurality of sense amplifier units amplify the data bits on associated bit line pairs, the plurality of sense amplifier units forming a cache storage for maintaining data bits while the activation signal stays at the active level; a decision means checking an address signal for a data access to one of the plurality of memory cell blocks to see whether or not accessed data is stored in one of the plurality of sense amplifier units, the decision means producing a hit signal indicative of the accessed bit stored in the one of the plurality of sense amplifier units; and a controlling means responsive to the hit signal for reading out the accessed data bit from the one of the plurality of sense amplifier units without energizing the plurality of word lines, the controlling means electrically connecting two of the plurality of sense amplifier units to the one of the plurality of memory cell blocks before selectively energizing the plurality of word lines in the absence of the hit signal.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 8:
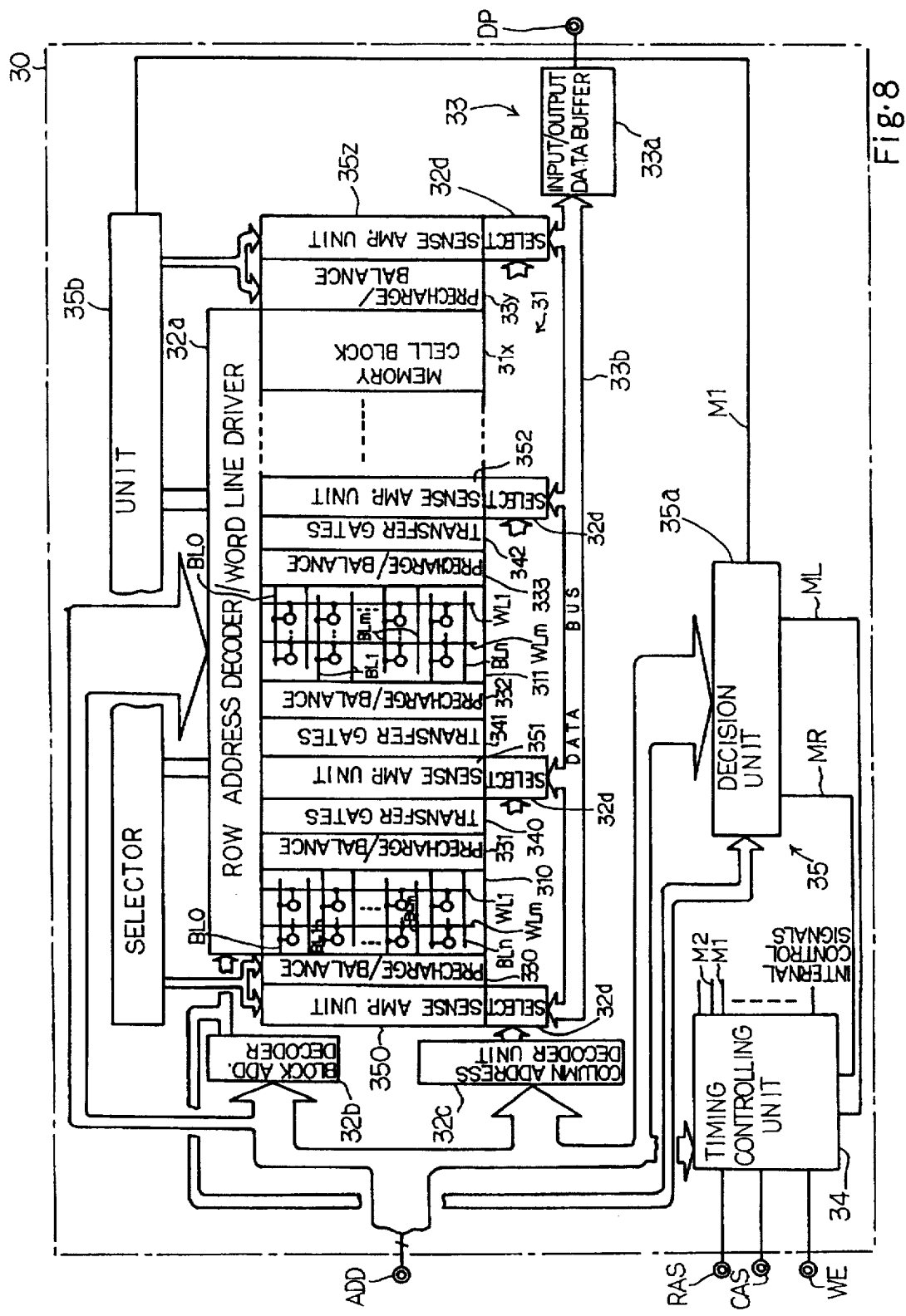
FIG. 8 is a block diagram showing the arrangement of a semiconductor dynamic random access memory device according to the present invention.

Referring first to FIG. 8 of the drawings, a semiconductor dynamic random access memory device embodying the present invention is fabricated on a semiconductor chip 30. The semiconductor dynamic random access memory device largely comprises a memory cell array 31, an addressing system 32, a read/write system 33, a timing controlling unit 34 and a cache controlling system 35. The memory cell array 31 is divided into a plurality of memory cell blocks 310, 311, . . . and 31x, and a plurality of memory cells form in combination each of the memory cell blocks 310 to 31x. The plurality of memory cells are arranged in rows and columns, and small circles represent the memory cells, respectively. Though not shown in the drawings, the memory cells are of the type implemented by a series of a switching transistor and a storage capacitor, and respectively store data bits in the form of electric charge.

A plurality of word lines WL1 to WLm are provided for each of the memory cell blocks 310 to 31x, and are respectively associated with the rows of memory cells. The plurality of word lines WL1 to WLm are coupled to the gate electrodes of the switching transistors of the associated rows of memory cells. A plurality of bit line pairs BL0, BL1, . . . , BLm and BLn are further provided for each of the memory cell blocks 310 to 31x, and are respectively associated with the columns of memory cells. Each of the bit line pairs BL0 to BLn consists of two bit lines, and the drain nodes of the switching transistors of the associated column of memory cells are selectively coupled to the bit lines of the associated pair.

The memory cell blocks 310 to 31x are respectively assigned block addresses. On the other hand, row addresses and column addresses are shared among the memory cell blocks 310 to 31x. The row addresses are respectively assigned to the word lines WL0 to WLm of each of the memory cell blocks 310 to 31x, and the column addresses are assigned to the bit line pairs BL0 to BLn of each memory cell block 310/311/ . . . /31x, respectively.

When one of the word lines WL0 to WLm is boosted to an active high level, the switching transistors of the associated row concurrently turn on, and the storage capacitors are electrically connected to the bit lines of the pairs BL0 to BLn.

The addressing system 32 includes an address port ADD, a row address decoder/word line driver unit 32a, a block address decoder unit 32b, the column address decoder unit 32c and column selector units 32d. A row address signal and a column address signal are supplied to the address port ADD in synchronism with a row address strobe signal RAS and a column address strobe signal CAS, and the addressing system 32 selects a memory cell from one of the memory cell blocks 310 to 31x. Though not shown in FIG. 8, the row address signal contains block address information and row address information, and column address information is carried by the column address signal.

The row address decoder/word line driver unit 32a is coupled to the plurality of groups of word lines WL0 to WLm, and selectively boosts the groups of word lines WL0 to WLm so as to electrically connect the storage capacitors of the associated row of memory cells to the bit lines of the pairs BL0 to BLn. The row address decoder/word line driver unit 32a selects one of the word lines groups in response to block address decoded signals, and boosts one of the word lines WL0 to WLm of the selected word line group on the basis of row address predecoded signals.

The block address decoder unit 32b is responsive to block address predecoded signals so as to generate the block address decoded signals. The block address decoded signals are supplied to not only the row address decoder/word line driver unit 32a but also the cache controlling system 35 as will be described hereinlater.

The column address decoder unit 32c decodes column address to column address decoded signals, and one of the column selectors 32d selects one of the bit line pairs BL0 to BLn of the selected memory cell block.

The read/write system 33 includes an input/output data buffer unit 33a coupled to a data port DP, a plurality of precharge/balance units 330, 331, 332, 333, ... and 33y, a plurality of transfer gate arrays 340, 342, ..., a plurality of sense amplifier units 350, 351, 352, ... and 35z and a data bus 33b coupled between the column selectors 32d and the input/output data buffer unit 33a.

The bit line pairs BL0, BL1, ..., BLm and BLn are alternately coupled to the precharge/balance units provided on both sides of each memory cell blocks. For example, the bit line pairs BL0, ... and BLm of the memory cell block 311 are coupled to the precharge/balance unit 333, and the remaining bit line pairs BL1, ... and BLn of the same block 311 are coupled to the precharge/balance unit 332. The bit line pairs BL0 to BLn are charged to and equalized at the middle level HVC similar to the prior art memory device.

The sense amplifier units 350 and 35z are exclusive to the memory cell blocks 310 and 31x, and are coupled to the bit line pairs BL0 to BLm of the memory cell block 310 and the bit line pairs BL1 to BLn of the memory cell block 31x, respectively. Each of the other sense amplifier units 351, 352 to 35(z–1) is shared between adjacent two memory cell blocks. For example, the sense amplifier unit 351 is shared between the memory cell blocks 310 and 311, and is coupled through the transfer gate array 340 to the bit line pairs BL1 to BLn of the memory cell block 310 and through the transfer gate array 341 to the bit line pairs BL1 to BLn of the memory cell block 311.

The transfer gate arrays 340, 341, 342, ... are coupled between the bit line pairs BL0, ... and BLm/BL1, ... and BLn and the sense amplifier units 351 to 35(z–1), and two transfer gate arrays such as 341/342, ... on both sides of the memory cell block concurrently turn on so as to couple the bit line pairs BL0 to BLn to the associated sense amplifier units. However, two transfer gate array such as 340/34a on both sides of the sense amplifier unit never concurrently turn on, and each of the sense amplifier units 350 to 35z is electrically connected to the associated bit line pairs BL0 to BLm or BL1 to BLn of one memory cell block.

The sense amplifier units 350 to 35z are respectively coupled to the column selector units 32d, and the sense amplifier circuits 33c of the sense amplifier units 350 to 35z are selectively connected through the associated column selector units 32d to the data bus 33b. The sense amplifier units 350 to 35z not only magnify data bits on the bit line pairs BL0 to BLn but also form in combination a cache storage.

Figure 1:
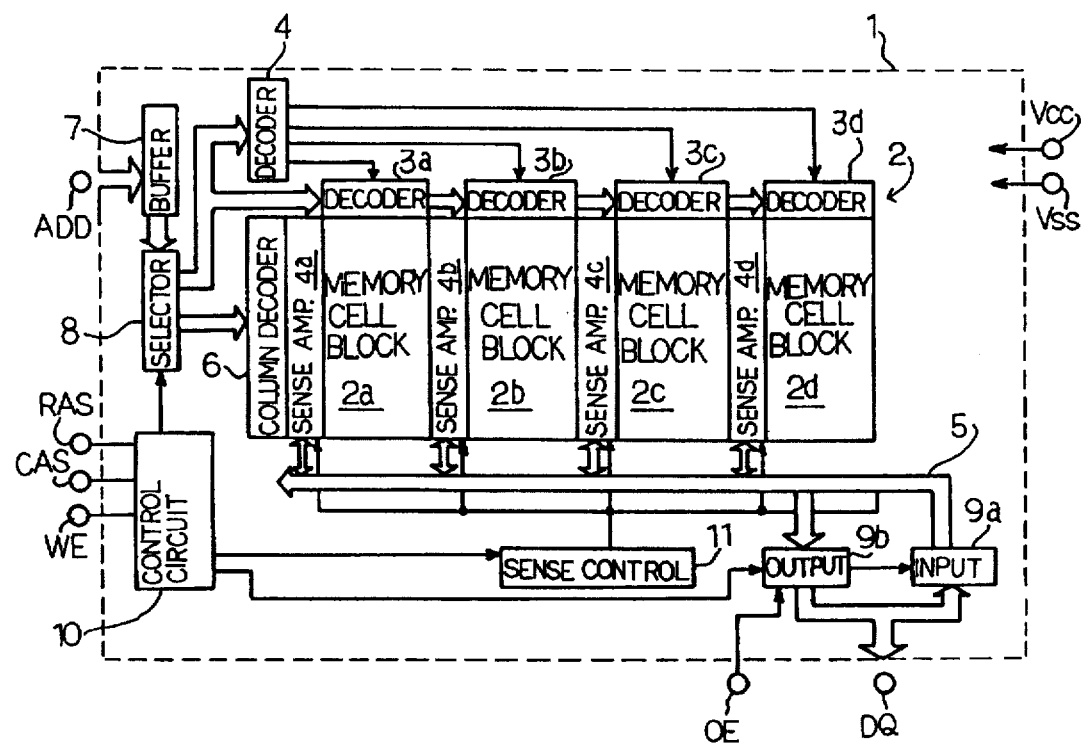
FIG. 1 is a block diagram showing the arrangement of the prior art standard dynamic random access memory device.
Figure 2:
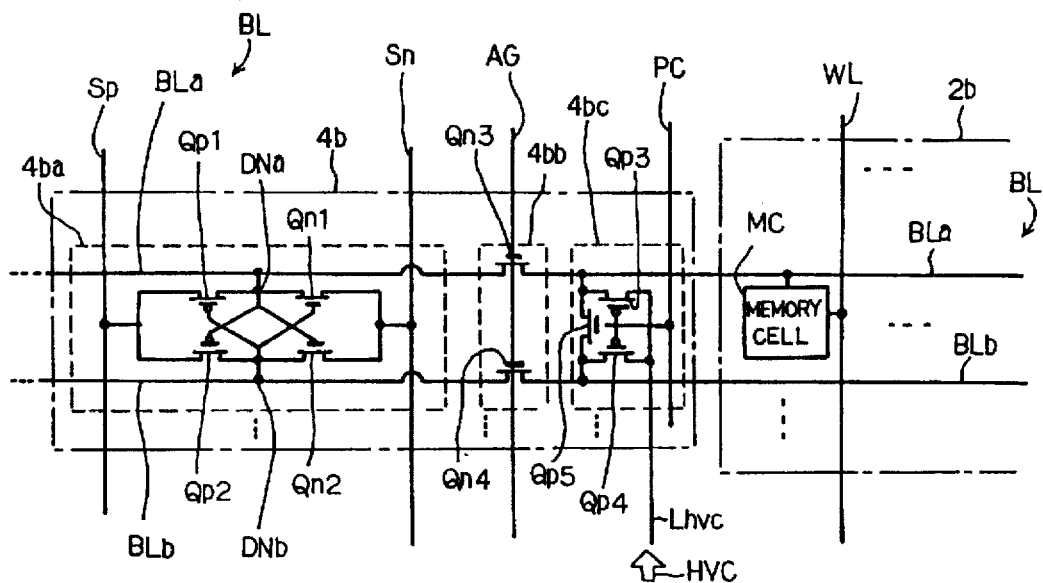
FIG. 2 is a circuit diagram showing the arrangement of the sense amplifier incorporated in the prior art standard dynamic random access memory device.
Figure 3:
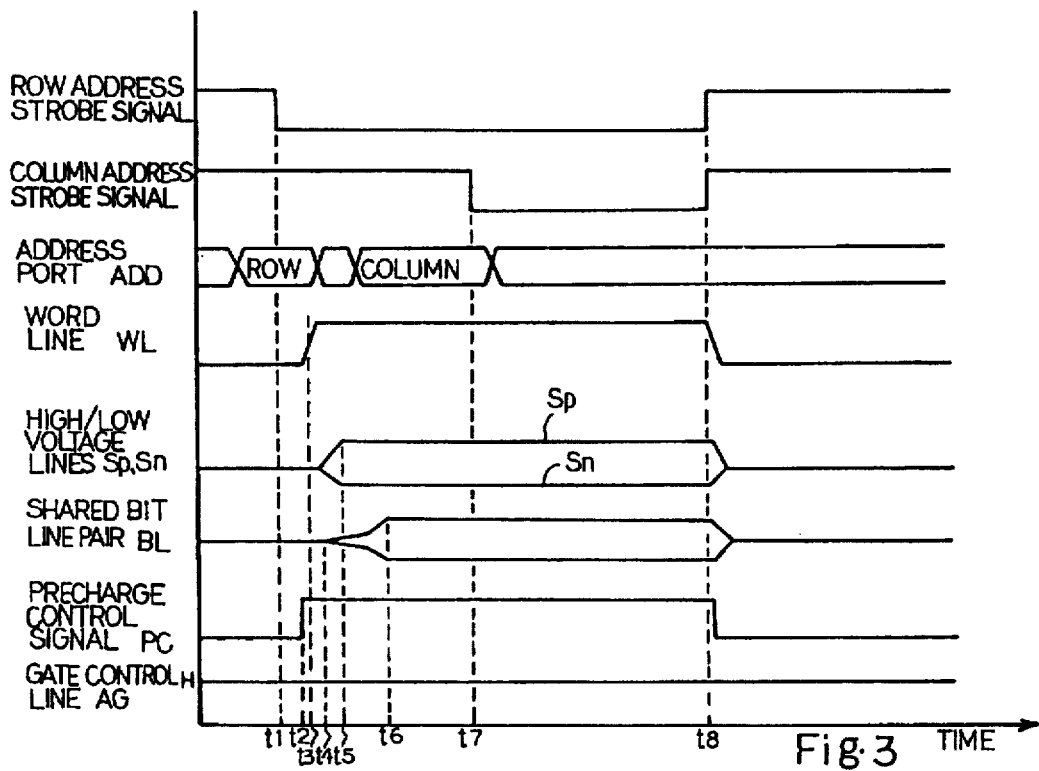
FIG. 3 is a timing chart showing the access procedure to the memory cell of the prior art standard dynamic random access memory device.
Figure 4:
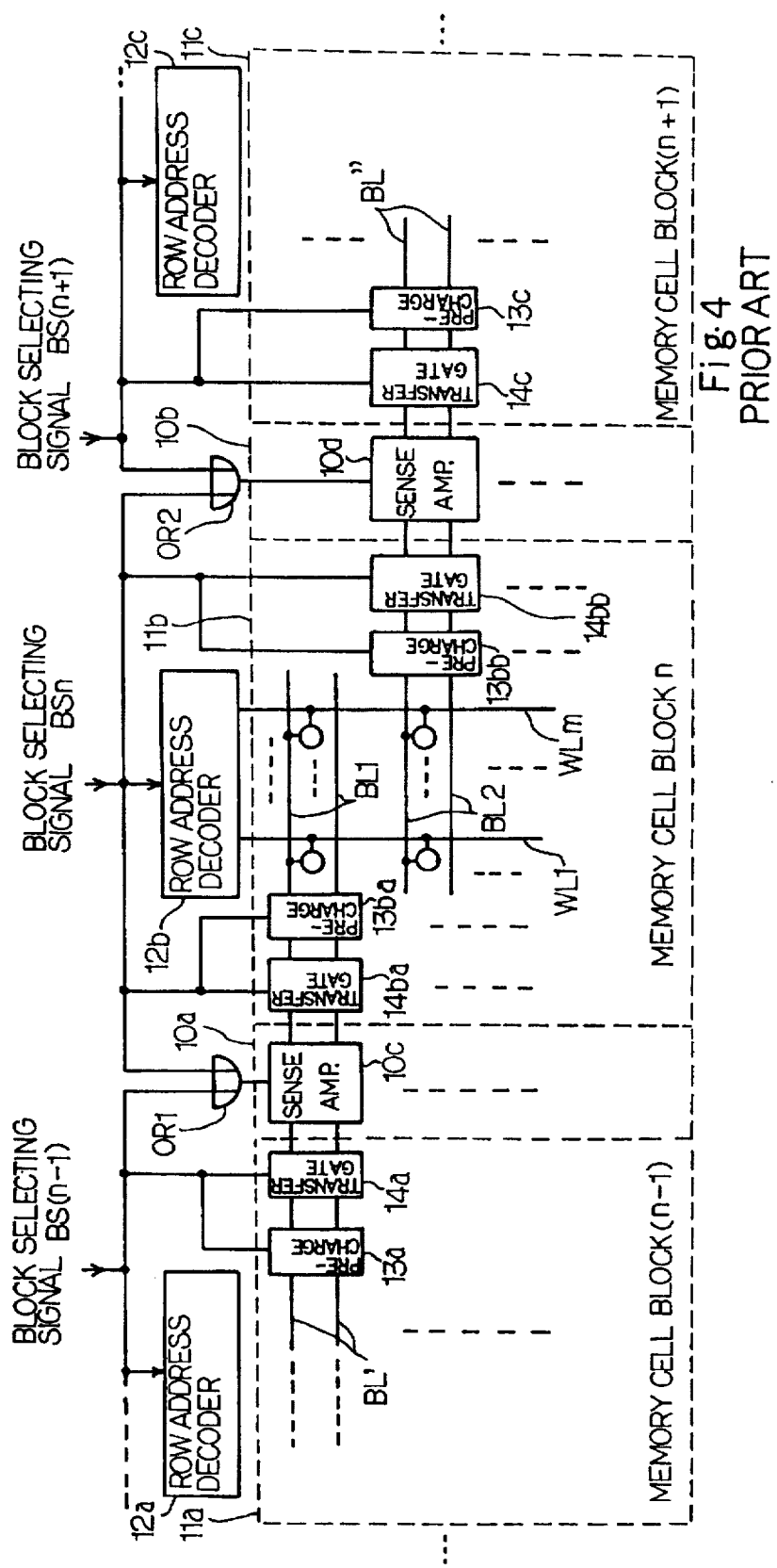
FIG. 4 is a circuit diagram showing the prior art dynamic random access memory device having shared sense amplifiers.
Figure 5:
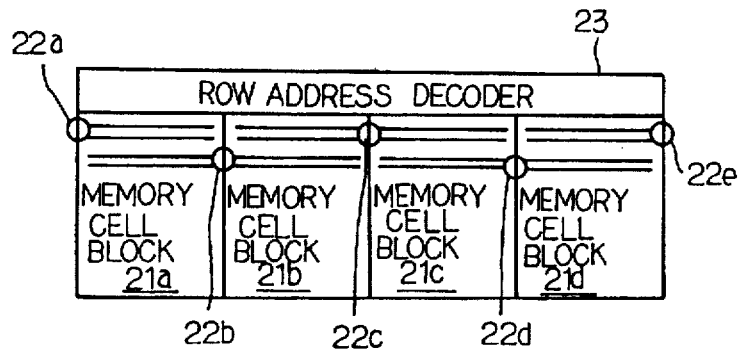
FIG. 5 is a block diagram showing the arrangement of the memory cell blocks of the prior art semiconductor dynamic random access memory device.
Figure 6:
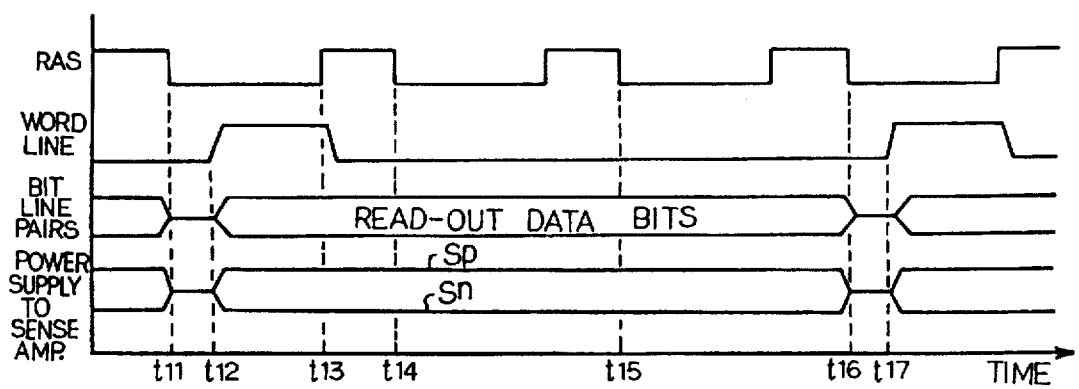
FIG. 6 is a timing chart showing the sequential read-out from the sense amplifier circuits serving as the cache storage.
Figure 7A:
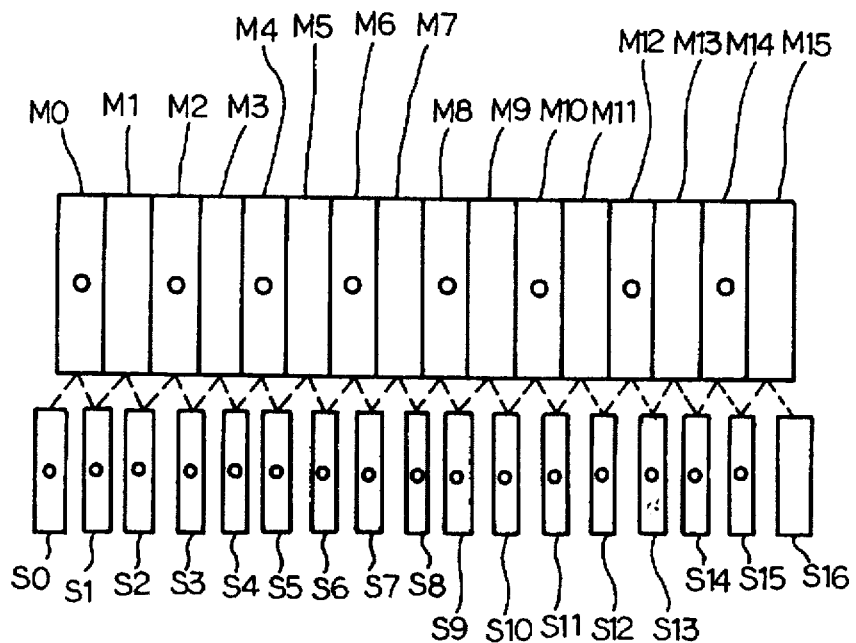
FIGS. 7A and 7B are views showing the relation between the selected memory cell blocks and the sense amplifier units available for the cache storage.
Figure 7B:
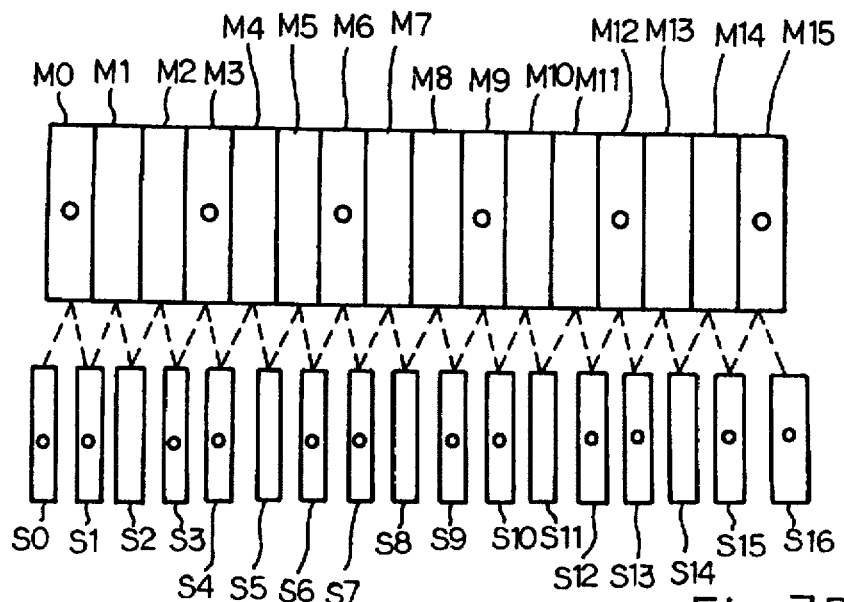

The precharge/balance circuits 33c of the units 330 to 33y, the transfer gate circuits 33d of the arrays 340, 341, 342, ... and the sense amplifier circuits 33e of the units 350 to 35z are similar in circuit arrangement to the precharge/balance circuit 4bc, the transfer gate circuit 4bb and the sense amplifier circuit 4ba shown in FIG. 2, and no further description is incorporated hereinbelow.

The timing controlling unit 34 is coupled to control signal pins assigned to external control signals such as the row address strobe signal RAS, the column address strobe signal CAS and a write enable signal WE, and sequentially generates internal control signals. The internal control signals provide appropriate timings for a write-in operation, a standard read-out operation and a quick read-out operation on data bits stored in the cache storage.

The cache controlling system 35 includes a decision unit 35a and a selector unit 35b. The decision unit 35a stores the row addresses assigned to the rows of memory cells the data bits of which are respectively held in the sense amplifier units 350 to 35z, and compares the stored row addresses with the row address indicated by the row address predecoded signals.

Figure 9:
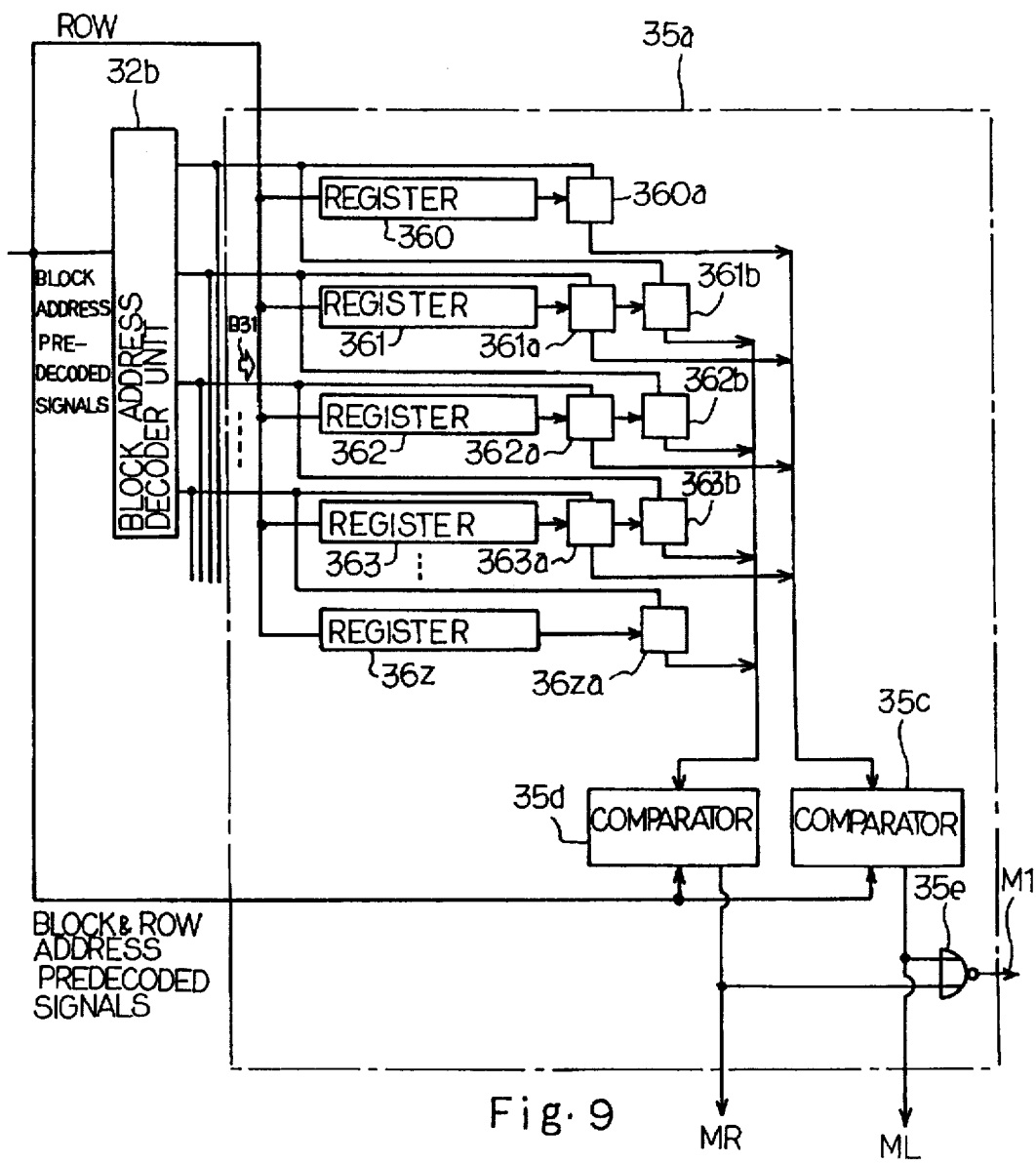
FIG. 9 is a circuit diagram showing the arrangement of a decision unit incorporated in the semiconductor dynamic random access memory device.

FIG. 9 illustrates the decision unit 35a, and the decision unit 35a includes registers 360, 361, 362, 363, ... and 36z equal in number to the sense amplifier units 350 to 35z, selectors 360a, 361a/361b, 362a/362b, 363a/363b, ... and 35za, two comparators 35c and 35d and a NOR gate 35e. The registers 360 to 36z are respectively associated with the sense amplifier units 350 to 35z, and store the block/row addresses assigned to the rows of memory cells the data bits of which are presently left in the associated sense amplifier units 350 to 35z. The block address decoded signals are selectively supplied to the selectors 360a to 360za, and the selectors 360a to 360za electricaly connect two registers 360/361, 361/362, 362/363, ... 36(z–1)/36z to the comparators 35c and 36d.

If the block address decoder unit 32b selects the memory cell block 311, the block address decoded signal indicative of the memory cell block 311 allows the selectors 361a and 362b to electrically connect the registers 361 and 362 to the comparators 35c and 35d, respectively. The registers 361 and 362 are corresponding to the sense amplifier unit 351 on the left side of the selected memory cell block 311 and the sense amplifier unit 352 on the right side of the selected memory cell block 311. Then, the selected registers 361 and 362 supply the stored block/row addresses to the comparators 35c and 35d, respectively, and the comparators 35c and 35d compare the stored block/row addresses with the block/row address represented by the block/row address predecoded signals.

If one of the stored block/row addresses is matched with the block/row address represented by the block/row address predecoded signals, the comparator 35c or 35d changes the output signal ML or MR to the high level indicative of the match between the stored block/row address and the supplied block/row address, and the other comparator 35d or 35c keeps the output signal MR or ML in the low level indicative of the mis-match. The output signals ML and MR are supplied to the timing controlling unit 34.

The output signals ML and MR are further supplied to the NOR gate 35e. When both output signals ML and MR are in the low level indicative of a mis-match, the NOR gate 35e changes the mis-hit signal M1 to the high level indicative of full word mis-hit. The mis-hit signal M1 is supplied to the selector unit 35b. If a word line is boosted on the basis of the decision between the high and mis-hit, the block/row addresses represented by the block/row address predecoded signals are written into the registers corresponding to the sense amplifier units on both sides of the accessed memory cell block.

Figure 10:
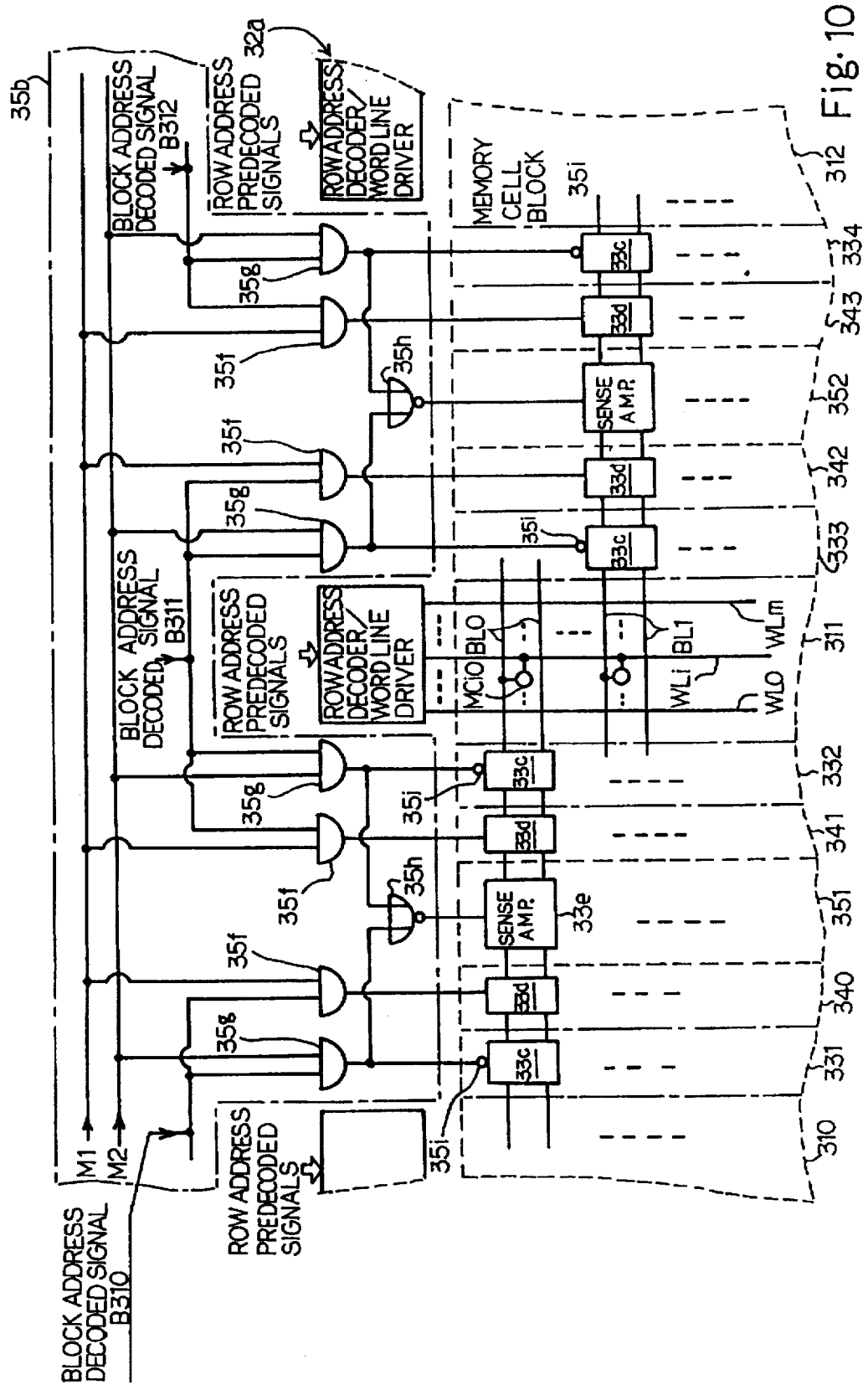
FIG. 10 is a circuit diagram showing the arrangement of a selector unit incorporated in the semiconductor dynamic random access memory device.

The circuit arrangement of the selector unit 35b is illustrated in FIG. 10. The selector unit 35b includes a plurality of first AND gates 35f respectively associated with the transfer gate units 340, 341, 342, ..., a plurality of second AND gates 35g respectively associated with the precharge/balance units 330 to 33y, a plurality of NOR gates 35h respectively associated with the sense amplifier units 350 to 35z and inverter circuits 35i coupled between the second AND gates 35g and the precharge/balance circuits 33c. The block address decoded signals are selectively supplied to the first AND gates 35f and the second AND gates 35g. The decision unit 35a supplies the mis-hit signal M1 to the first AND gates 35f, and the timing controlling unit 34 supplies a precharge control signal M2 to the second AND gates 35g. In case of data write-in, the timing controlling unit 34 further supplies the mis-hit signal M1 to the first AND gates 35f. The output nodes of the adjacent two second AND gates 35g are connected to the input nodes of the NOR gate 35h, and the output signal of the NOR gate 35h controls the high and low power supply lines for the sense amplifier circuits 33e.

Assuming now that the decision unit 35a generates the mis-hit signal M1 of the active high level for the access to the memory cell block 311, while the precharge control signal M2 is staying in the active high level, the block decoded signal B311 of the high level causes the second AND gates 35g to yield the output signals of the high level, and the inverters 35i allow the precharge/balance circuits 33c to charge and balance the bit line pairs BL0 to BLm and BL1 to BLn. The mis-high signal M1 of the active high level also causes the first AND gates 35f to open the transfer gate circuits 33d.

After the precharge/equalization, the precharge control signal M2 is changed to the inactive low level, and the second AND gates 35g change the output signals to the low level, and the inverters 35i cause the precharge/balance circuits 33c to isolate the bit line pairs BL0 to BLm and BL1 to BLn from a source of precharge level (not shown). One of the word lines WL0 to WLm is boosted, and potential differences take place on the bit line pairs BL0 to BLn. The output signals of the second AND gates 35g are supplied to the NOR gate 35h, and the NOR gate 35h separates the high and low power supply lines to the high and low levels. Then, the sense amplifier circuits 33e start the magnification of the potential differences on the bit line pairs BL0 to BLn.

Figure 11:
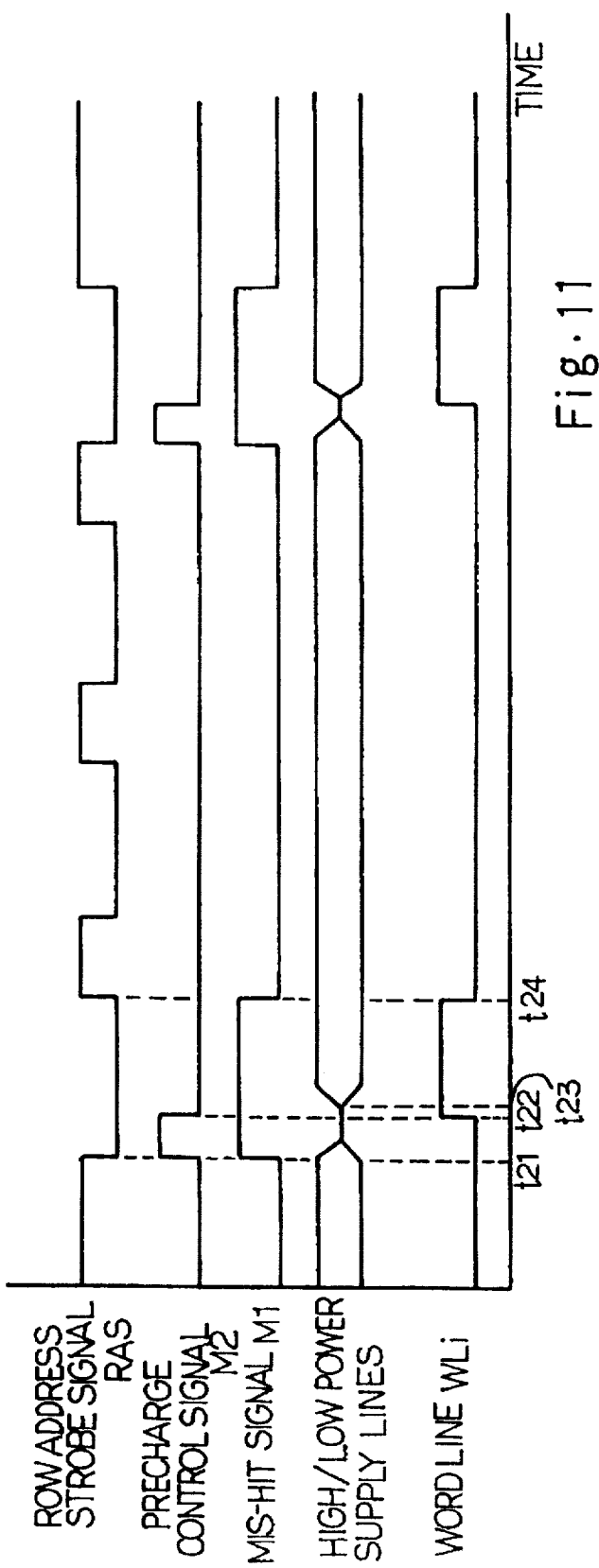
FIG. 11 is a timing chart showing a quick read-out sequence for access to a cache storage.
Figure 12:
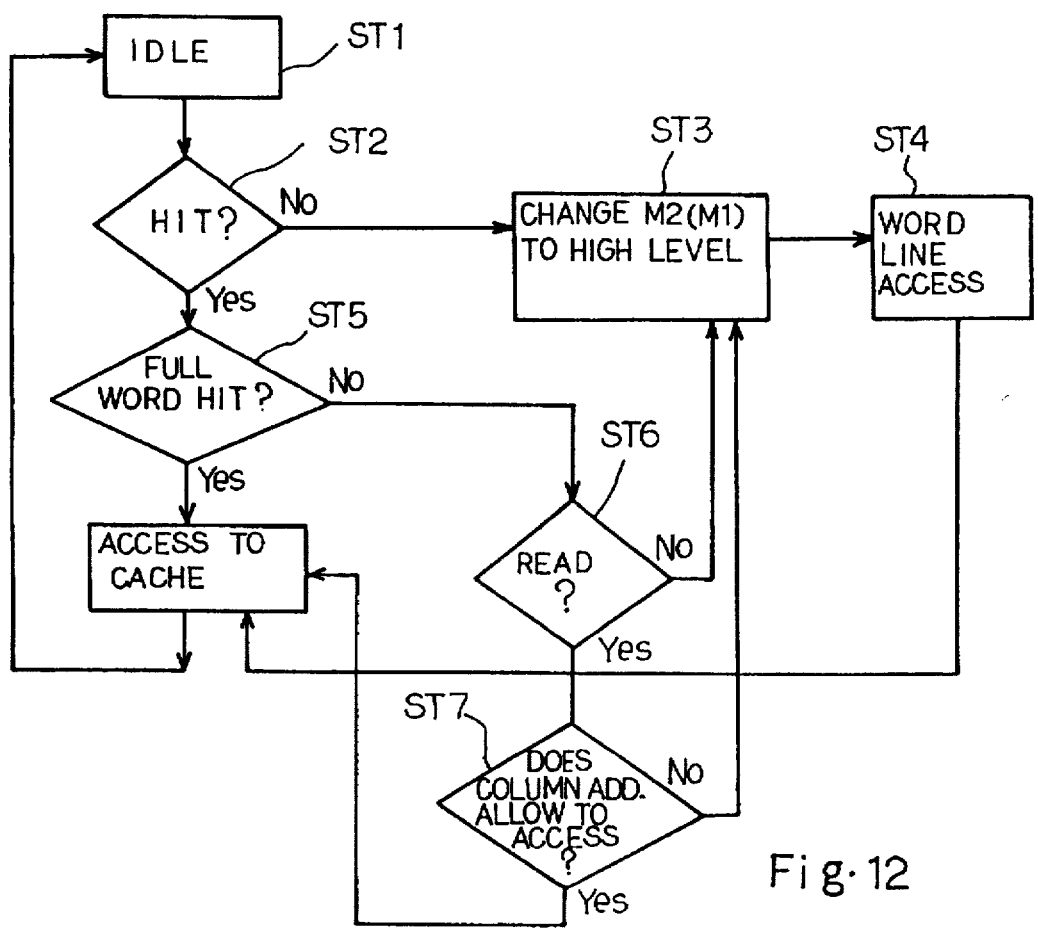
FIG. 12 is a flow chart showing the function of a timing controlling unit incorporated in the semiconductor dynamic random access memory device.

The description of the quick read-out operation, the standard read-out operation and the write-in operation assumes that the memory cell MCi0 (see FIG. 10) is accessed. FIG. 11 illustrates the quick read-out sequence, and FIG. 12 illustrates the function of the timing controlling unit 34.

An external device changes the row address strobe signal RAS to the active low level at time t21, and supplies the external row address signal indicative of the memory cell block 311 and the word line WLi. The sense amplifier unit 351 is assumed to have already stored the data bits read out from the memory cell block 310, and the registers 362 and 363 have stored the block address of the memory cell block 310 and 312.

The block address decoder unit 32b changes the block address decoded signal B311 to the high level, and the selector 362a and 363a connects the registers 362 and 363 to the comparators 35c and 35d, respectively. The comparators 35c and 35d compare the block/row addresses stored in the registers 362 and 363 with the block/row addresses represented by the block and row address predecoded signals. The stored block/row addresses are not matched with the supplied block/row addresses, and the comparators 35c and 35d keep the output signals ML and MR to the low level indicative of the mis-match. The NOR gate 35e changes the mis-hit signal M1 to the active high level.

The mis-hit signal M1 is ANDed with the block address decoded signal B311, and the first AND gates 35f cause the transfer gate units 341 and 342 to turn on so as to connect the bit lines BL0 to BLn of the memory cell block 311 to the sense amplifier units 351 and 352. However, the other block address decoded signals cause the other first AND gates 35f to close the associated transfer gate units.

With the output signals ML and MR, the timing controlling unit 34 proceeds from step ST1 to step ST2, and checks the input nodes assigned to the output signals MR and ML to see whether or not at least one of the output signals MR and ML is in the high level indicative of the match. Both of the output signals MR and ML are in the low level, and the answer at step ST2 is given negative.

The timing controlling unit 34 proceeds to step ST3, and changes the precharge control signal M2 to the high level.

The first AND gates 35f cause the transfer gate units 341 and 342 to turn on in the presence of the mis-hit signal M1 of the active high level, and the second AND gates 35g and the associated inverter 35i cause the precharge/balance units 332 and 333 to charge and equalize the bit line pairs BL0 to BLn.

Upon completion of the precharge/equalization, the timing controlling unit 34 changes the precharge control signal M2 to the inactive low level at time t22. Then, the timing controlling unit 34 supplies an internal control signal to the row address decoder/word line driver unit 32a, and allows the row address decoder/word line driver 32a to respond to the row address predecoded signals as by step ST4. Then, the row address decoder/word line driver unit 32a boosts the word line WLi, and data bits are read out from the row of memory cells coupled to the word line WLi to the bit line pairs BL0 to BLn.

The precharge control signal M2 of the low level causes the second AND gates 35g to change the output signals to the low level, and the NOR gates 35h changes the output signals to the active high level. Then, the high and low power supply lines are separated from the middle level, and activate the sense amplifier units 351 and 352 at time t23. The sense amplifier units 351 and 352 magnify the potential differences on the bit line pairs BL0 to BLn. Though not shown in FIG. 11, the external device supplies the column address signal in synchronism with a column address strobe signal, and the timing controlling unit 34 causes the column address decoder unit 32c and the column selector 32d to transfer the potential difference on the bit line pair BL0 to the data bus 33b. The input/output data buffer unit 33a generates the output data signal from the potential difference on the data bus 33b.

The block/row addresses represented by the block/row address predecoded signals are stored in the registers 362 and 363. The decision unit 35a changes the mis-hit signal M1 to the inactive low level, and the timing controlling unit 34 causes the row address decoder/word line driver unit 32a to reset the word line WLi. However, the high and low power supply lines continuously supply the high and low power voltages to the sense amplifier units 351 and 352, and the data bits stored in the row of memory cells coupled to the word line WLi until the mis-hit signal M1 takes place again.

If the sense amplifier units 351 and 352 store the data bits read out from the memory cells of the memory cell block 311 coupled to the word line WLi and the data bits read out from the memory cell block 312, the register 362 stores the block/row addresses assigned to the memory cells coupled to the word line WLi, and the other register 363 stores the block address assigned to the memory cell block 312. Although the comparator 35c changes the output signal ML to the high level, the other comparator 35d keeps the output signal MR in the low level. The NOR gate 35e keeps the mis-hit signal M1 in the inactive low level.

In this situation, the answer at step St2 is given affirmative, and the timing controlling unit 34 checks the output signals ML and MR to see whether or not both output signals ML and MR are in the active high level as by step ST5. The answer at step ST5 is negative, and the timing controlling unit 34 checks the control signal pin to see whether or not the write enable signal WE is indicative of a read-out operation as illustrated by step ST6.

If the write enable signal WE requests write-in, the answer at step ST6 is given negative, and the timing controlling unit changes the signals M1 and M2 to the high level, and starts the write-in sequence.

On the other hand, if the write enable signal WE is indicative of a read-out, the timing controlling unit 34 proceeds to step ST7, and checks the column address predecoded signals to see whether the selected column has been connected to the sense amplifier unit 351 as illustrated by step ST7.

If one of the bit lines BL1 to BLn is selected, the answer at step ST7 is given negative, and the timing controlling unit 34 changes the signals M1 and M2 to the high level as similar to the write-in operation.

On the other hand, if one of the bit line pairs BL0 to BLm is selected, the answer at step ST7 is given affirmative, and the timing controlling unit 34 supplies the internal control signal to the column address decoder unit 32c so as to respond the column address predecoded signals. The column address decoder unit 32c causes the column selector 32d to transfer the potential difference on the selected bit line pair BL0 to the data bus 33b, and the input/output data buffer unit 33a generates the output data signal.

If the sense amplifier units 351 and 352 have stored the data bits read out from the memory cells coupled to the word line WLi, the registers 362 and 363 store the block/row addresses assigned to the memory cells coupled to the word line Wli, and the comparators change both output signals ML and MR to the active high level. However, the NOR gate 35e does not change the mis-hit signal M1 to the high level.

The timing controlling unit 34 is given affirmative answers at steps ST2 and ST5, and causes the column address decoder unit 32c and the column selector 32d to transfer the potential difference on the selected bit line pair BL0 to the data bus 33b without boosting the word line WLi. If the write enable signal WE requests a write-in, the potential difference indicative of the write-in data bit is transferred to the sense amplifier circuit 33e connected to the selected bit line pair. The data bits stored in the sense amplifier units may be restored in the row of memory cells.

In this instance, the timing controlling unit 34 and said selector unit 35b as a whole constitute a controlling means.

As will be appreciated from the foregoing description, the cache system 35 individually controls the sense amplifier units 350 to 35z, and increases the direct access to the sense amplifier unit. As a result, the hit ratio is increased, and the through-put is enhanced.

Second Embodiment

Another semiconductor dynamic random access memory device embodying the present invention includes registers corresponding to the registers 360 to 36z to which dirty bits are respectively added.

Figure 13:
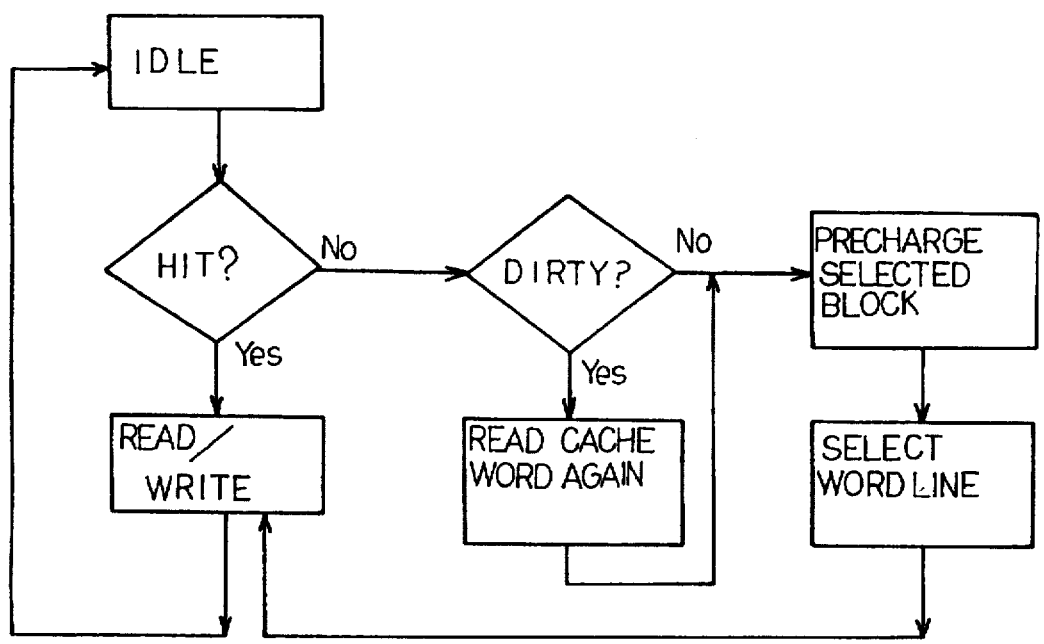
FIG. 13 is a flow chart showing the function of a timing controlling unit incorporated in another semiconductor dynamic random access memory device according to the present invention.

FIG. 13 illustrates the behavior of the semiconductor dynamic random access memory device. When a data access takes place from the idle state, the decision is carried out to see whether a hit takes place. In case of a "hit", data is read out from or written into the sense amplifier unit. Therefore, high-speed operation is achieved.

If only one of the sense amplifier units stores data bits read out from the selected memory cell block, the data bits stored in the sense amplifier unit are partially different from the data bits stored in the row of memory cells. Then, the dirty bit of the register associated with the sense amplifier unit is changed to a logic "1" level.

If the continuous memory access is mis-hit, the dirty bit is checked, and the data bits stored in the sense amplifier unit are restored in the original memory cells through the word line control, and, thereafter, the memory access is carried out. While the data bits are restored, the other data bits are read out to the other bit line pairs, and are amplified by the other sense amplifier unit.

After the data bits in the sense amplifier unit are restored, the dirty bit is reset to zero, and a word line is boosted for the memory access.

Thus, the data bits in the cache storage are matched with the data bits stored in the corresponding row of memory cells by using the dirty bit.

Although particular embodiments of the present invention have been shown and described, it will be obvious to those skilled in the art that various changes and modifications may be made without departing from the spirit and scope of the present invention.

For example, the cache controlling system according to the present invention may be available for another kind of semiconductor memory device in so far as sense amplifiers are incorporated therein.

Moreover, the decision unit may be provided the outside of the semiconductor chip so as to supply the hit signals MR and ML and the mis-hit signal M1 to the timing controlling unit provided on the semiconductor chip. The decision shown in FIG. 12 may be carried out outside of the semiconductor chip.

What is claimed is:

1. A semiconductor memory device comprising:

a memory cell array including a plurality of memory cell blocks formed by memory cells arranged in an array in a row direction and a column direction, a plurality of bit line pairs connected to columns of said memory cells, respectively, and a plurality of word lines connected to rows of said memory cells, respectively; and a plurality of sense amplifiers connected to ends of said plurality of bit line pairs, respectively, and responsive to an activation signal for magnifying potential differences on said plurality of bit line pairs, said plurality of sense amplifiers being divided into a plurality of sense amplifier groups each shared between an adjacent two of said plurality of memory cell blocks so as to be used by a selected one of said adjacent two of said plurality of memory cell blocks, said plurality of sense amplifier groups forming a cache storage so that data is read out from said plurality of sense amplifiers when a row address selected in a data access operation to said memory cells is matched with a row address assigned to a row of memory cells supplying said data to said plurality of sense amplifiers, said plurality of sense amplifier groups being individually controlled during an access to said cache storage.

2. A semiconductor memory device comprising:

a memory cell array including a plurality of memory cell blocks each having memory cells arranged in rows and columns;

a plurality of bit line pair groups respectively associated with said plurality of memory cell blocks, the bit line pairs of each of said plurality of bit line pair groups being respectively connected to columns of said memory cells of an associated one of said plurality of memory cell blocks;

a plurality of word lines respectively coupled to rows of said memory cells of said plurality of memory cell blocks, and selectively energized so as to read out data bits to associated bit line pairs;

a plurality of sense amplifier units including shared sense amplifier units each shared between two of said plurality of bit line pair groups, and responsive to an activation signal of an active level so that two of said plurality of sense amplifier units amplify said data bits on the associated bit line pairs, said plurality of sense amplifier units forming a cache storage for maintaining said data bits while said activation signal remains in said active level;

a decision means for checking an address signal indicative of a first address for data to be accessed from one of said plurality of memory cell blocks to determine whether or not said data to be accessed is stored in one of said plurality of sense amplifier units, said decision means producing a hit signal if said data to be accessed is stored in said one of said plurality of sense amplifier units; and a controlling means responsive to said hit signal for reading out said data bits from said one of said plurality of sense amplifier units without energizing said plurality of word lines, said controlling means electrically connecting two of said plurality of sense amplifier units to said one of said plurality of memory cell blocks before selectively energizing said plurality of word lines in the absence of said hit signal.

3. The semiconductor memory device as set forth in claim 2, in which said decision means includes:

a plurality of registers respectively associated with said plurality of sense amplifier units so as to respectively store second addresses assigned to rows of memory cells supplying data bits to said plurality of sense amplifier units in a rewritable manner, a comparator means for comparing said first address with the second addresses for producing said hit signal; and a plurality of selector units selectively coupled between said plurality of registers and said comparator means so as to supply said second addresses from two of said plurality of registers corresponding to said two of said plurality of sense amplifier units to said comparator means.

4. The semiconductor memory device as set forth in claim 3, in which said decision means further includes:

a logic gate coupled to said comparator means for producing a mis-hit signal when said second addresses are different from said first address, said controlling means being responsive to said mis-hit signal for coupling said two of said plurality of sense amplifier units to said one of said plurality of memory cell blocks.

* * * * *

UNITED STATES PATENT AND TRADEMARK OFFICE
CERTIFICATE OF CORRECTION

PATENT NO. : 5,706,244
DATED : January 6, 1998
INVENTOR(S) : Tamio SHIMIZU

It is certified that error appears in the above-identified patent and that said Letters Patent is hereby corrected as shown below:

TITLE PAGE, ITEM [30]:

In the Foreign Application Priority Data, change "Oct. 28, 1995" to --Oct. 28, 1994--.

Signed and Sealed this

Twenty-second Day of December, 1998

Attest:

BRUCE LEHMAN

*Attesting Officer*     *Commissioner of Patents and Trademarks*